US005119788A

United States Patent [19]

Fritz et al.

[11] Patent Number: 5,119,788

[45] Date of Patent: Jun. 9, 1992

[54] METHOD AND ARRANGEMENT FOR DETERMINING AT LEAST ONE THRESHOLD VOLTAGE FOR A LAMBDA-ONE CONTROL

[75] Inventors: Adolf Fritz, Ditzingen; Jürgen Zimmermann, Schwieberdingen; Christian Rein, Ispringen, all of Fed. Rep. of Germany

[73] Assignee: Robert Bosch GmbH, Stuttgart, Fed. Rep. of Germany

[21] Appl. No.: 700,146

[22] PCT Filed: Oct. 19, 1989

[86] PCT No.: PCT/DE89/00664

§ 371 Date: May 22, 1991

§ 102(e) Date: May 22, 1991

[87] PCT Pub. No.: WO90/05840

PCT Pub. Date: Mar. 31, 1990

[30] Foreign Application Priority Data

Nov. 24, 1988 [DE] Fed. Rep. of Germany ....... 3839634

[51] Int. Cl.[5] ...................... F02D 41/14; G01N 27/50; G01R 19/165

[52] U.S. Cl. .................................................... 123/688

[58] Field of Search ........................ 123/440, 489, 589; 204/424, 425, 426

[56] References Cited

U.S. PATENT DOCUMENTS

| | | | |
|---|---|---|---|
| 4,156,413 | 5/1979 | Taplin | 123/440 |
| 4,169,440 | 10/1979 | Taplin et al. | 123/489 |
| 4,300,507 | 11/1981 | Reddy | 123/489 |
| 4,345,562 | 8/1982 | Drews et al. | 123/489 X |
| 4,492,205 | 1/1985 | Jundt et al. | 123/489 |
| 4,528,957 | 7/1985 | Jundt et al. | 123/440 |
| 5,040,513 | 8/1991 | Schnaibel et al. | 123/489 X |
| 5,054,452 | 10/1991 | Denz | 123/489 X |

*Primary Examiner*—Willis R. Wolfe

*Attorney, Agent, or Firm*—Walter Ottesen

[57] ABSTRACT

In a method for determining at least one threshold voltage in controlling lambda one, this voltage is no longer set to a precisely predetermined value with the aid of a high-precision reference voltage source; instead, a counter voltage, connected in opposition to the probe voltage, is measured and the threshold voltage is referred or the threshold voltages are referred to the measured value and the absolute amount of the measured voltage does not have to be known. This method makes it possible to manage without a high-precision reference voltage source and without high-precision resistors. Instead, an arrangement according to the invention has a means for measuring the counter voltage and a means for referring threshold voltages to the counter voltage.

6 Claims, 1 Drawing Sheet

METHOD AND ARRANGEMENT FOR DETERMINING AT LEAST ONE THRESHOLD VOLTAGE FOR A LAMBDA-ONE CONTROL

FIELD OF THE INVENTION

The invention relates to a method for determining at least one threshold voltage for a lambda-one control comprising a lambda probe which is connected in opposition to a voltage which essentially corresponds to the desired switching voltage. In addition, the invention relates to a arrangement for carrying out such a method.

BACKGROUND OF THE INVENTION

From U.S. Pat. No. 4,528,957 a configuration for detecting the voltage of the lambda probe is known which utilizes a counter-voltage source, the voltage of which is connected in opposition to that of the lambda probe. Two threshold voltages are referred to the counter voltage, namely an upper threshold voltage $U_O$ and a lower threshold voltage $U_U$. The counter voltage is, for example, 450 mV and the threshold voltages are separated therefrom by 50 mV upwards or downwards, respectively. If the measured voltage reaches one of the two thresholds, the system switches from open-loop to closed-loop control.

In closed-loop control operation, control is effected in the direction of lean as long as the voltage measured is above a switch-over threshold voltage and control is effected in the direction of rich if it is below this voltage. As a rule, the switch-over threshold voltage is close to the counter voltage, for example 10 mV above it.

In the case of the example mentioned, the counter voltage is therefore 450 mV, the upper switch-on threshold voltage 500 mV, the lower switch-on threshold voltage 400 mV and the switch-over threshold voltage 460 mV. Each voltage value is permanently associated with a digital value. In the case of the example, these are assumed to be the values 130, 143, 117 and 132, respectively.

In order to be able to set the voltage values accurately, a high-precision reference voltage source is used, that is, not the conventional voltage stabilizer which supplies, among others, the usual logic voltage of +5V for electronic components. The voltage of the reference voltage source is divided by means of high-precision constant-temperature resistors in such a manner that the desired counter voltage is accurately obtained. The threshold voltages are referred to this accurately set counter voltage. In addition to the calibration with the aid of the precise resistors, a software calibration can also be effected so that the predetermined digital value for the counter voltage is accurately obtained.

SUMMARY OF THE INVENTION

The invention is based on the object of being able to manage without the high-precision reference voltage source and without high-precision resistors. A method and an arrangement will be provided for this.

The method according to the invention is characterized in that the counter voltage is measured and threshold voltages are referred to the measured counter voltage. If the measured counter voltage is, for example, 460 mV instead of 450 mV, the upper switch-on threshold voltage $U_O$ is set to 510 mV instead of 500 mV. It is noted that, strictly speaking, it is not known whether the counter voltage is 455 mV or 465 mV since, of course, a high-precision reference voltage source for comparison is lacking. However, it is not important to know this precisely, either, since other voltages of importance, for example the switch-on threshold voltages, are, of course, referred to the measured voltage. This ensures that, for example, the two switch-on threshold voltages are always symmetrical with respect to the counter voltage independently of what the precise value of the counter voltage is. To obtain the value for the upper switch-on threshold voltage, 13 units are basically added, for example, to the digital value of the measured counter voltage or 13 units are subtracted in order to obtain the lower switch-on threshold voltage. Correspondingly, other spacings or even unsymmetrical spacings can be set.

Apart from the switch-on threshold voltages, the switch-over threshold voltage is also advantageously referred to the measured voltage.

Due to the fact that threshold voltages are referred to the measured counter voltage, it is no longer necessary to set the counter voltage to an accurately predetermined value with the aid of a high-precision reference voltage source and with the aid of high-precision resistors. Instead, the voltage from the conventional voltage stabilizer can be utilized and normal-precision resistors can be used.

If only the switch-on threshold voltages are corrected, then it is sufficient to measure the counter voltage with a cold lambda probe. This is the case, in particular, when an internal combustion engine is started in which the lambda probe is used, but also after relatively long overrun phases.

If changes in the switch-over threshold voltage are also to be detected, such as are caused, for example, by temperature-related or aging-related changes of resistance values or gain factors, it is recommended to measure the counter voltage at regular time intervals and to always refer the switch-over threshold voltage to the measured counter voltage.

An arrangement for carrying out the above-mentioned method has a means for measuring the counter voltage and a means for referring threshold voltages to the counter voltage.

BRIEF DESCRIPTION OF THE DRAWINGS

In the following, the invention will be explained in greater detail with reference to embodiments illustrated by figures, in which.

DESCRIPTION OF THE PREFERRED EMBODIMENTS OF THE INVENTION

Figure 1:
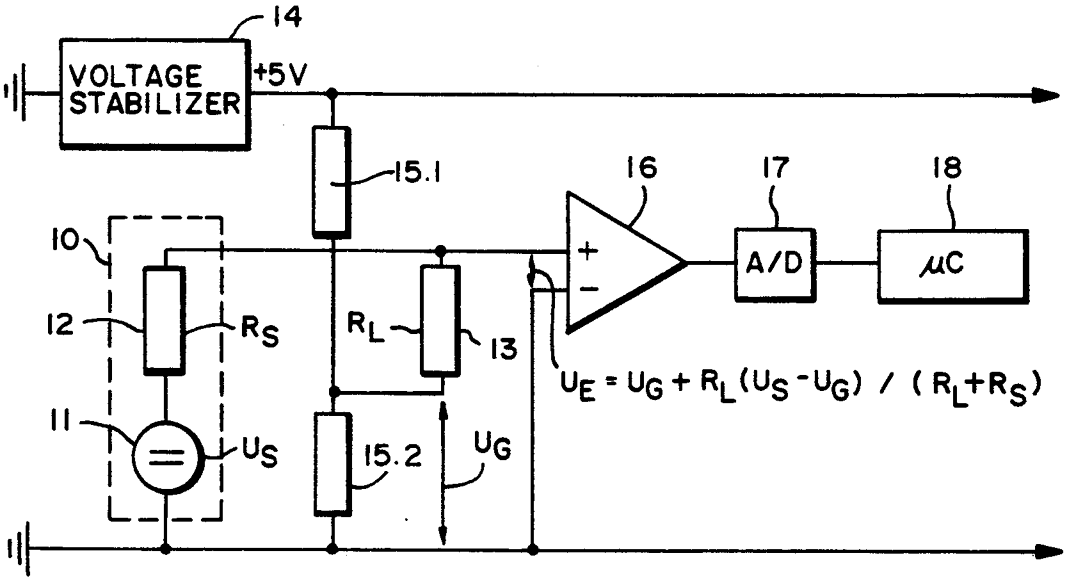
FIG. 1 shows a circuit diagram of a probe loaded with a counter voltage, the counter voltage being generated with the aid of the voltage of a conventional voltage stabilizer.

The circuit according to FIG. 1 has, among others, a lambda probe 10 which is represented by its equivalent circuit diagram, namely by a direct-voltage source 11 with the probe voltage $U_S$ and a resistor 12 with the internal resistance value $R_S$. A counter voltage $U_G$ is connected in opposition to the probe voltage via a load resistor 13 having the resistance value $R_L$. This counter voltage is generated by dividing the +5 V voltage of a voltage stabilizer 14. It is assumed to be 450 mV in the illustrative embodiment. However, this value fluctuates by a good 5% upwards and downwards since the output voltage of the voltage stabilizer 14 depends on its input voltage, that is, the battery voltage, on the loading of the stabilizer and on temperature and aging influences. In addition, there is a spread from circuit to circuit with respect to the output voltages of the voltage stabilizers due to production tolerances. Further causes for the range of fluctuation of the counter voltage $U_G$ are production tolerances of the voltage divider resistors 15.1 and 15.2 and changes in their resistance values due to temperature and aging effects.

The probe voltage $U_S$ and the counter voltage $U_G$ are combined as follows to form the input voltage $U_E$ at a differential amplifier 16:

$$U_E = U_G + R_L (U_S - U_G)/(R_L + R_S)$$

This voltage is supplied to an A/D converter 17, the digital output values of which are processed for lambda control purposes by a microcomputer 18.

In the microcomputer 18, a check is made in particular whether the input voltage $U_E$ has exceeded an upper switch-on threshold voltage $U_O$ or has dropped below a lower switch-on threshold voltage $U_U$. In the embodiment, these threshold voltages are no longer at precisely predetermined values but are higher or lower by predetermined counts than the count which is obtained at the output of the A/D converter 17 when the counter voltage $U_G$ is measured with the aid of the differential amplifier 16.

Figure 2:
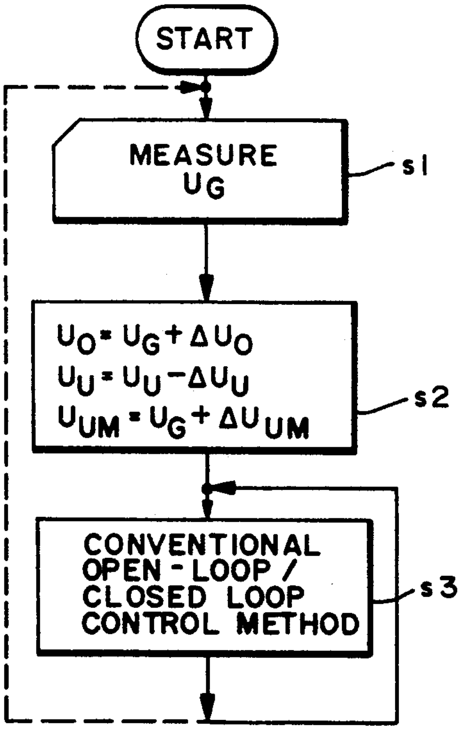
FIG. 2 shows a flowchart for explaining a method according to which threshold voltages are referred to a measured counter voltage; and, FIGS. 3 and 4 show circuit diagrams for explaining possibilities for measuring the counter voltage.

The above-mentioned sequence is shown in the flowchart of FIG. 2. The counter voltage $U_G$ is measured in a step s1. In a step s2, a difference value $\Delta U_O$ is added to the measured voltage in order to obtain the value for the upper switch-on threshold voltage $U_O$, a difference $\Delta U_U$ is subtracted in order to obtain the lower switch-on threshold voltage $U_U$ and a voltage $\Delta U_{UM}$ is added in order to provide a switch-over threshold voltage $U_{UM}$. If the input voltage $U_E$ exceeds or drops below the switch-over threshold voltage, the direction of control reverses in each case.

A conventional open-loop/closed-loop control method is carried out in a subprogram according to a step s3. The subprogram according to step s3 is executed repeatedly. This repeated execution can be preceded by an ever-new measurement of the counter voltage and determination of threshold voltages. This is represented by the broken return line in FIG. 2. The return to step s1 can occur after each run of step s3. However, it is not necessary to run steps s1 and s2 as frequently as this since the counter voltage changes only slowly due to temperature and aging effects and load-dependent effects scarcely play a role with a running internal combustion engine. It is therefore normally sufficient to measure the counter voltage only once when the internal combustion engine is put into operation. However, in order to enhance the accuracy, measurements can also be taken at predetermined times, for example at intervals of several seconds, or when predetermined operating conditions occur. One operating condition triggering the measurement can be overrun operation which lasts for some seconds. In this case, the probe cools down, in fact in the case of a prolonged overrun operation to such an extent that it is even no longer ready for closed-loop control operation when the overrun operation is ended. During overrun operation, there is sufficient time available for carrying out steps s1 and s2 since no closed-loop control processes are in progress. If overrun operation ends, the values determined in step s2 can be used for checking whether the probe is ready for closed-loop control operation.

The equation specified further above reveals that the input voltage $U_E$ corresponds to the counter voltage $U_G$ with a very high internal resistance value $R_S$ of the probe. At a probe temperature of about 250° C., the internal resistance value $R_S$ is more than 1 MOhm, while the load resistance value $R_L$ is only in the order of magnitude of some 100 Ohm. When the internal combustion engine is started, that is when the probe is still quite cold or during a longer-lasting overrun operation when the probe temperature falls below about 300° C., the counter voltage can thus be measured in the simplest manner by the fact that it is equated with the measured input voltage $U_E$.

When the probe is hot, the measuring method mentioned above fails. However, the voltage can then be measured as illustrated in FIGS. 3 and 4.

Figure 3:
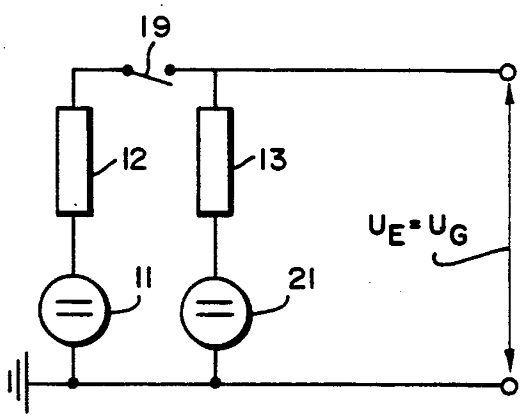

For measuring the counter voltage, the probe voltage is disconnected by opening a switch 19 according to FIG. 3 so that the input voltage $U_E$ is identical with the counter voltage $U_G$. In the variant according to FIG. 4, one tap exists directly at the positive terminal of the counter-voltage source and the voltage value present at this tap is applied by a change-over switch 20 to the positive input of the differential amplifier 16. In the circuit diagrams of FIGS. 3 and 4, the counter voltage is generated by a counter-voltage source 21. The actual construction of the latter is of no significance.

Figure 4:
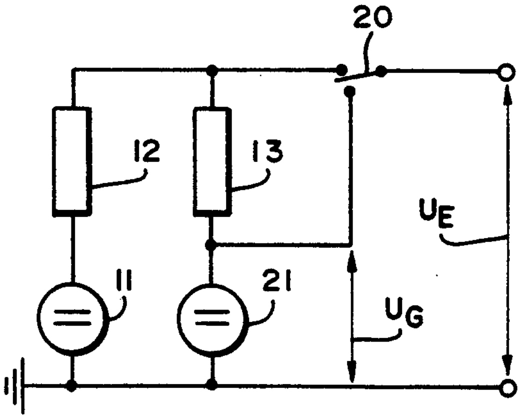

The switch 19 in the circuit diagram according to FIG. 3 or the change-over switch 20 in the circuit diagram according to FIG. 4, together with the differential amplifier 16, the A/D converter 17 and the microcomputer 18, are used as means for measuring the counter voltage. In the embodiment according to FIG. 1, the measuring of the counter voltage is controlled by the fact that the microcomputer 18 triggers the measuring process when a predetermined condition occurs, for example, when the internal combustion engine is started or after a prolonged overrun operation or, if the internal resistance of the probe is being measured, when this internal resistance exceeds a particular threshold value. It is noted that, when the measurement is taken at the time the internal combustion engine is started, this measurement is preferably delayed until the engine has performed some revolutions. If measurements were taken earlier, in the worst case at the instant when the starter is still being actuated, it could be possible that a counter voltage is measured which no longer exists at all during later operation. This is because, during the starting process and shortly thereafter, the output voltage from the voltage stabilizer 14 has dropped to such a low value which no longer occurs during the entire further operation.

The microcomputer 18 is not only a part of the means for measuring the counter voltage but it is also a means for referring threshold voltages to the measured counter voltage. The microcomputer 18 also has memories available which either store the measured counter voltage or threshold voltages calculated with the aid of the counter voltage.

We claim:

1. An arrangement for determining at least one threshold voltage in controlling lambda one, the arrangement comprising:

a lambda probe;

counter voltage supply means for supplying a counter voltage counter connected to said lambda probe;

circuit means for separating said lambda probe from said counter voltage supply means and for measuring said counter voltage; and means for referring said threshold to the counter voltage.

2. A method for determining at least one threshold voltage in controlling lambda one, the method comprising the steps of:

providing a lambda probe and connecting a counter voltage to the lambda probe in opposition thereto;

measuring the counter voltage; and, referring the threshold voltage to the counter voltage.

3. The method of claim 2, further comprising the steps of: utilizing the switch-over threshold voltage for switching over the direction of closed-loop control; and, referring the switch-over threshold voltages to the measured counter voltage.

4. The method of claim 2, wherein the counter voltage is measured at regular time intervals.

5. The method of claim 2, wherein the counter voltage is measured when the lambda probe is cold.

6. The method of claim 5, further comprising the steps of: utilizing switch-on threshold voltages for detecting readiness for closed-loop control operation of the probe; and, referring the switch-on threshold voltages to the measured counter voltage.

* * * * *

UNITED STATES PATENT AND TRADEMARK OFFICE

CERTIFICATE OF CORRECTION

PATENT NO. : 5,119,788

DATED : June 9, 1992

INVENTOR(S) : Adolf Fritz, Jürgen Zimmermann and Christian Rein

It is certified that error appears in the above-identified patent and that said Letters Patent is hereby corrected as shown below:

In column 1, line 15: after "U.S. Pat. No. 4,528,957", insert -- , --.

In column 5, line 9: after "and", insert -- , --.

In column 5, line 10: between "threshold" and "to", insert -- voltage --.

Signed and Sealed this

Twenty-eighth Day of September, 1993

Attest:

BRUCE LEHMAN

*Attesting Officer* | *Commissioner of Patents and Trademarks*